US006387717B1

(12) United States Patent
Blalock et al.

(10) Patent No.: US 6,387,717 B1
(45) Date of Patent: May 14, 2002

(54) FIELD EMISSION TIPS AND METHODS FOR FABRICATING THE SAME

(75) Inventors: Guy T. Blalock; Sanh D. Tang, both of Boise, ID (US); Zhaohui Huang, Santa Clara, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/559,153

(22) Filed: Apr. 26, 2000

(51) Int. Cl.[7] .............................................. H01L 21/00

(52) U.S. Cl. .......................... 438/20; 438/34; 438/673; 438/712; 438/713; 445/49; 445/50; 445/51; 445/24; 313/309

(58) Field of Search ........................... 438/20, 34, 673, 438/712, 713; 445/49, 50, 51, 24; 313/309

(56) References Cited

U.S. PATENT DOCUMENTS 4,968,382 A * 11/1990 Jacobson et al. ........... 156/643
5,312,514 A 5/1994 Kumar
5,329,207 A 7/1994 Cathey et al.
5,372,973 A 12/1994 Doan et al.
5,438,240 A 8/1995 Cathey et al.
5,509,840 A 4/1996 Huang et al.
5,532,177 A 7/1996 Cathey
5,587,720 A 12/1996 Fukuta et al.
5,620,832 A 4/1997 Sung et al.
5,628,661 A 5/1997 Kim et al.
5,632,664 A 5/1997 Scoggan et al.
5,637,023 A 6/1997 Itoh et al.
5,643,032 A 7/1997 Cheng et al.
5,647,785 A * 7/1997 Jones et al. ................... 445/24
5,648,699 A 7/1997 Jin et al.
5,669,801 A 9/1997 Lee
5,675,210 A 10/1997 Kim
5,698,932 A 12/1997 Cathey, Jr. et al.

* cited by examiner

*Primary Examiner*—John F. Niebling
*Assistant Examiner*—David A. Zarneke
(74) *Attorney, Agent, or Firm*—TraskBritt

(57) ABSTRACT

The present invention relates to field emitters and methods of fabricating the same wherein the field emission tips of the field emitters are formed by utilization of a facet etch. An etch mask is patterned on a conductive substrate in the locations desired for subsequently formed field emission tips. The conductive substrate is then anisotropically etched to translate the shape of the mask into the conductive substrate which forms a vertical column from the conductive substrate. The etch mask is then removed and the vertical column is facet etched to form the field emission tip.

Low work function materials may also be incorporated into the field emission tips to improve field emission tip performance by depositing a layer of low work function material on the conductive substrate prior to patterning the etch mask. Furthermore, a sacrificial layer may be utilized to assist the removal of any redeposition materials formed during the facet etch by depositing the sacrificial material over the vertical column prior to facet etching. After facet etching, the redeposition material may be removed using a known clean-up technique.

44 Claims, 9 Drawing Sheets

FIELD EMISSION TIPS AND METHODS FOR FABRICATING THE SAME

BACKGROUND OF THE INVENTION

1. Field of the Invention

The present invention relates to field emitters and methods of fabricating the same. More particularly, the present invention relates to forming field emission tips by the use of facet etching.

2. State of the Art

Various types of field emitters are used in a variety of devices, from electron microscopes to ion guns. However, one of the most prevalent commercial applications of field emitters is flat panel displays, such as cold cathode field emission displays ("FEDs" ) used for portable computers and other lightweight, portable information display devices.

As illustrated in FIG. 18, an exemplary flat panel cold cathode FED 200 comprises a flat vacuum cell 202 having a cathode 204 and an anode 206 spaced apart from one another in a mutually parallel relationship. The cathode 204 comprises a conductive or semiconductive first material 208, such as silicon, disposed on a substrate 212, such as a semiconductive or dielectric material, and an array of minute field emission tips 214 distributed across the material 208. The anode 206 comprises a conductive second material 216 disposed on an interior surface of a transparent plate 218, and a phosphorescent or fluorescent material 222 coated on the conductive second material 216. A conductive structural element, called a gate 224, is disposed in the space between the cathode 204 and anode 206. The gate 224 is generally formed atop a grid of dielectric material 226 deposited on the cathode 204. The field emission tips 214 reside within openings in the gate 224 and in the dielectric material 226, such that the gate 224 surrounds each field emission tip 214. The gate 224 acts as a low potential anode (i.e., lower potential than the anode 206), such that when a voltage differential, generated by a voltage source 228, is applied between the cathode 204 (strong negative charge), the gate 224 (weak positive charge), and the anode 206 (strong positive charge), a Fowler-Nordheim electron emission is initiated resulting in a stream of electrons 232 being emitted from the field emission tips 214 toward the phosphorescent or fluorescent material 222. The electron stream 232 strikes and stimulates the phosphorescent or fluorescent material 222. The stimulated phosphorescent or fluorescent material 222 emit photons (light) (not shown) through the conductive second material 216 and the transparent plate 218 to form a visual image.

FIGS. 19–23 illustrate a conventional method of forming a field emission tip. As shown in FIG. 19, a substrate of conductive or semiconductive material 252, such as silicon, is deposited or formed over a dielectric support 254. A mask material is patterned (such as by lithography) to beneath a mask element 256 at the position of the emission tip 258 to be formed. The conductive or semiconductive material 252 is then etched, such as by a wet etch or an isotropic dry etch, which "undercuts" the mask element 256 to form a sharp field emission tip 258 beneath the mask element 256, as shown in FIG. 20. The mask element 256 is then removed, as shown in FIG. 21. Although such a method is commonly used to form field emission tips 258, the method has drawbacks. For example, as shown FIG. 22, if the etching is halted too soon, inefficient, blunt field emission tips 262 are formed. Further, if the etching is not halted soon enough, the mask element 256 is undermined and the field emission tips 264 formed are short and may be ineffective, as shown in FIG. 23 (shown with the mask element 256 collapsed onto the conductive or semiconductive material 252). In other words, the short field emission tip 264 may not be close enough to a gate in a field emission display to generate a sufficient stream of electrons striking the phosphorescent or fluorescent material on the anode to stimulate the material and form a visual image.

Other field emission tip formation techniques which do not involve isotropic etching are also known. For example, U.S. Pat. 5,312,514 issued May 17, 1994 to Kumar ("the Kumar patent" ) relates to forming field emission tips by distributing a discontinuous etch mask material across an electrically conductive material layer. The discontinuity of the etched mask material forms random openings therein. The etch mask material is selected such that the electrically conductive material layer will etch at a faster rate than the etch mask material (at least twice the rate) when the electrically conductive material layer is ion etched. The ion etch is performed until all of the etch mask is removed, which results in v-shaped valleys in the electrically conductive material defining peaked field emission tips therebetween. Further, the Kumar patent discusses using a low work function material for the electrically conductive material layer and also discusses depositing a low work function material over the electrically conductive material after the formation of the field emission tips. Although the method taught in the Kumar patent eliminates the use of an isotropic etch to form field emission tips, it lacks control over the field emission tip distribution and dimensions. The discontinuous layer of etch mask material results in a non-uniform distribution of field emission tips, since the positions of the openings in the discontinuous layer cannot be controlled. Furthermore, the discontinuous layer of etch mask material results in non-uniform dimensions between the field emission tips, since the thickness difference across the discontinuous layer cannot be controlled. In other words, the field emission tips formed in areas where less etch mask material existed over the conductive material will be shorter than in other areas. Moreover, since the etch mask material is a discontinuous layer rather than a patterned mask, the size or diameter of the field emission tips formed cannot be controlled.

Thus, it can be appreciated that it would be advantageous to develop a technique which would result in novel field emission tips having uniform distribution and uniform, precise dimensions.

SUMMARY OF THE INVENTION

The present invention relates to field emitters and methods of fabricating the same, wherein the field emission tips of the field emitters are formed by utilization of a facet etch.

In an exemplary method of the present invention, an etch mask is patterned on a conductive substrate material in the locations desired for subsequently formed field emission tips. The etch mask can be patterned in various shapes in order to achieve a desired field emission tip structure. For example, a circular mask element will result in a conical field emission tip, a triangular mask element will result in a tetrahedral field emission tip, a square mask element will result in a pyramidal field emission tip, and so on. The conductive substrate material is anisotropically etched to translate the shape of the mask into the underlying conductive substrate material, which forms a vertical column having a cross-section with the same shape as the mask element, from the conductive substrate material. The anisotropic etch is conducted for a predetermined duration of time, which will result in a column of a specific height required for the subsequently formed field emission tip. The etch mask element is then removed (optional) and the vertical column is facet etched to form the field emission tip.

The facet etching is generally performed in a chamber in which ions can be accelerated to strike a substrate, such as reactive ion etchers, magnetically enhanced reactive ion etchers, low pressure sputter etchers, and high density source etchers. As opposed to anisotropic etches, such as ion etching or plasma etching processes, in which ions strike the surface of the substrate substantially perpendicular to result in a vertical etch, a facet etch results in ions dispersed in a fashion which results in the ions striking 90 degree features (i.e., corners) of structures on the substrate at a rate which is about four to five times that of the rate at which ions strike substantially planar surfaces (e.g., surfaces laying substantially perpendicular to the ion emission source) on the substrate. In fact, with facet etching, the planar surfaces experience very little substrate loss. The facet etch creates a gradual slope of about 45 degrees at the corners of the structures on the substrate.

The facet etch is preferably performed in a reactive ion etcher wherein the substrate is placed on a cathode within a high vacuum chamber into which etchant gases are introduced in a control manner. A radio frequency power source creates a plasma condition in the high vacuum chamber which generates ions. The walls of the high vacuum chamber are grounded to allow for a return radio frequency path. Due to the physics of the radio frequency powered electrodes, a direct current self-bias voltage condition is created at the substrate location on the cathode, which causes in the generated ions in the plasma to accelerate toward and strike the substrate. The etchant gases utilized in the facet etch are preferably inert gases, including, but not limited to, helium, argon, krypton, and xenon. These inert gases have been found to enhance the uniformity of the facet etch process. It is, of course, understood that any other suitable gas or mixture of gases which are inert with respect to the material of the substrate may also be used.

Thus, the present invention eliminates the use of isotropic etching to form field emission tips and, thereby, eliminates the problems associated with isotropic etching. Although the present invention requires more steps than the typical isotropic etching technique of forming field emission tips, the methods of the present invention result in more uniform distribution, size, and height for the field emission tips, since the location and size of the etch mask elements defining the tip locations, as well as the depth of the anisotropic etch, can be precisely controlled. This precise control results in a field emission tip array having regular uniform tip spacing as well as precise, uniform tip height, thus improving the performance and reliability of the field emission display device formed therefrom. Furthermore, the precise control of the tip spacing allow the tips to be pack closer to one another which a higher fidelity screen with more pixels per square inch.

The present invention also allows for low work function materials to be easily incorporated into the field emission tips. The overall work function of a field emission tip effects its ability to effectively emit electrons. The term "work function" relates to the voltage (or energy) required to extract or emit electrons from a field emission tip. The lower the work function, the lower the voltage required to produce a particular amount of electron emission. Thus, the incorporation of low work function materials in field emission tips can substantially improve their performance for a given voltage draw.

A variety of low work function materials can be incorporated into the field emission tips of the present invention. Such low function materials include, but are not limited to, $AlTiSi_x$ (aluminum titanium silicide [wherein x is generally between 1 and 4]), $TiSi_xN$ (titanium silicide nitride), TiN (titanium nitride), $Cr_3Si$ (tri-chromium mono-silicon), TaN (tantalum-nitride), or the like. Moreover, other low work function materials, such as metals including cesium (Ce), and cermets including $Cr_3Si—SiO_2$ (tri-chromium mono-silicon silicon-dioxide), $Cr_3Si—MgO$ (tri-chromium mono-silicon magnesium-oxide), $Au—SiO_2$ (gold silicon-dioxide), and Au—MgO (gold magnesium oxide), may also be used.

One embodiment of the invention for incorporating low work function materials into the field emission tips according to the present invention involves depositing a low work function material on a conductive substrate material. The low work function material may be deposited by ion beam sputtering, laser deposition, evaporation, chemical vapor deposition (CVD), and sputtering. An etch mask is then patterned on the low work function material to form discrete mask elements in the locations desired for the field emission tips to be formed. The low work function material and conductive substrate material are then anisotropically etched to form a column under each etch mask element from the conductive substrate material and a portion of the low work function material. The etch mask elements are then removed (optional). The vertical columns, capped with the low work function material, are then facet etched to form an array of low work function material tipped, field emission tips. Redeposition material, comprising a mixture of material from the vertical column substrate material and the low work function material, generated by the facet etch collects in corners at junctions of the vertical columns and the base conductive substrate during the facet etch.

Another embodiment of the invention for incorporating low work function materials into the field emission tips according to the present invention involves incorporating a sacrificial layer to assist the removal of redeposition material from the field emission tip. As with the previously discussed embodiments of the present invention, a low work function material is deposited on a conductive substrate material. An etch mask is patterned to form etch mask elements on the low work function material in the locations desired for the field emission tips to be formed. The low work function material and conductive substrate material are then anisotropically etched under such mask elements to form vertical columns from the conductive substrate material capped by a portion of the low work function material. The etch mask elements are then removed (optional). A sacrificial material, such as silicon dioxide or tetraethyl orthosilicate (TEOS), is then conformally deposited over the array of vertical columns, each capped with the low work function material, to form a covered structure. The covered structures are then facet etched to form an array of low work function material tipped, field emission tips. Redeposition material generated by the facet etch, comprising a mixture of material from the vertical column, the low work function material, and the sacrificial material, collects in exposed corners of the sacrificial material at a junction of the vertical column and the conductive substrate during the facet etch. Although such redeposition material would be difficult to remove if deposited directly on the conductive material of the tips and underlying substrate, the presence of the sacrificial material under the redeposition material allows the redeposition material to be easily removed using a clean-up technique, such as by a hydrofluoric acid (HF) dip or a diluted HF dip, as known in the art. The mask element is then removed, as known in the art.

Thus, the present invention allows for easy incorporation of a variety of materials on top of the field emission tips to improve their performance.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings, in which:

DETAILED DESCRIPTION OF THE PREFERRED EMBODIMENTS

FIGS. 1–16 illustrate various methods of forming field emission tips according to the present invention. It should be understood that the illustrations are not meant to be actual views of any particular field emission device, but are merely idealized representations which are employed to more clearly and fully depict the formation of field emission tips of the present invention than would otherwise be possible. Additionally, elements common to FIGS. 1–16 retain the same numerical designation.

Figure 1:
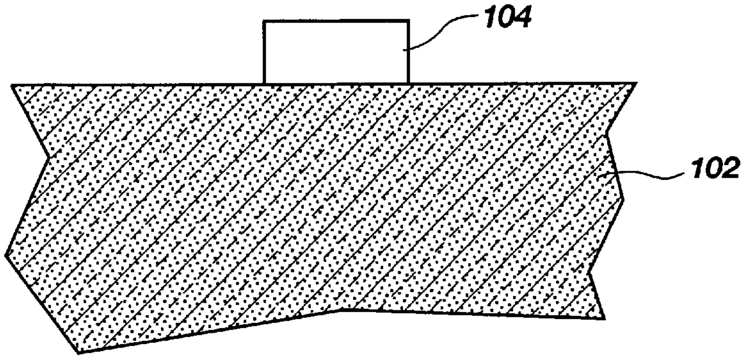
FIGS. 1–4 are cross-sectional views of one embodiment of a method for forming field emission tips according to the present invention.
Figure 2:
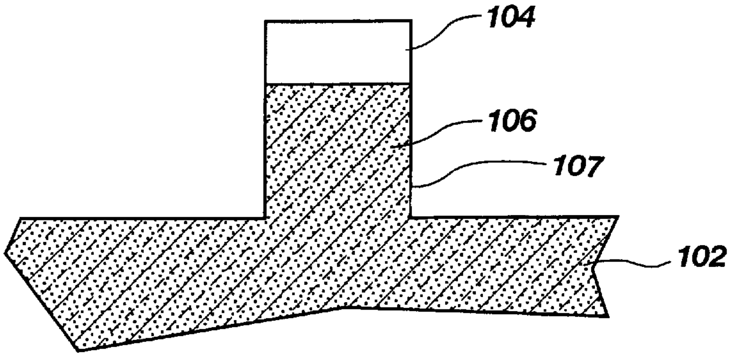
Figure 3:
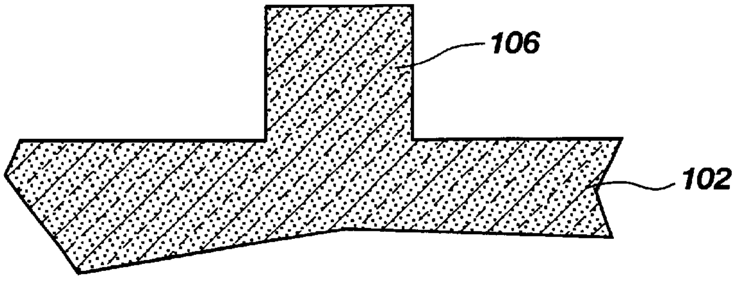
Figure 4:
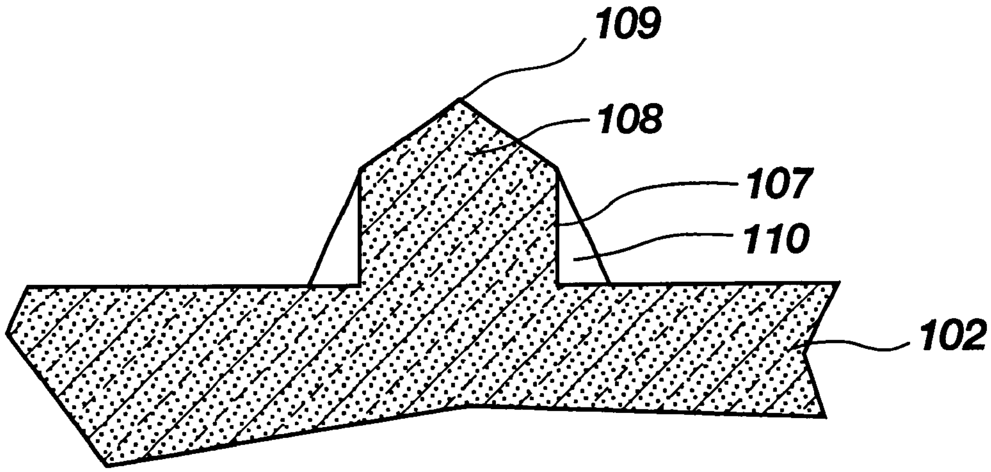

FIGS. 1–4 illustrate one embodiment for forming field emission tips according to the present invention. As shown in FIG. 1, an etch mask material, such as a photoresist material, is patterned by photolithography to define an etch mask element 104 on a substrate 102, such as a wafer of semiconductor material (e.g., silicon) or a silicon on insulator (SOI) type substrate, such as a silicon on glass (SOG) or silicon on sapphire (SOS) substrate. The substrate 102 may also be conductive material layered over a dielectric substrate (not shown). The substrate 102 is then anisotropically etched by dry etch techniques, such as physical sputtering or plasma etching, to form under etch mask element 104, from the substrate 102 a vertical column 106 of substantially constant cross-section and exhibiting substantially vertical sidewalls 107 relative to a plane of substrate 102, as shown in FIG. 2. For example, the anisotropic etch may be a plasma dry etch at a power of about 250 watts, a pressure of about 85 mTorr, and an etchant gas mixture comprising hydrobromic acid (HBr) gas, delivered at a rate of about 10 sccm, and chlorine gas ($C1_2$), delivered at a rate of about 60 sccm. The etch mask element 104 is removed from the vertical column 106, as shown in FIG. 3. The vertical column 106 is facet etched to form a substantially pointed field emission tip 108 with a sharp apex 109, as shown in FIG. 4. As an example, the facet etch may include a reactive ion etch (RIE) or a magnetically enhanced reactive ion etch (MERIE) conducted at a power of about 600 watts to about 800 watts, at a pressure of about 20 mTorr to about 50 mTorr, under a magnetic field of about 40 gauss, and employing an etchant gas comprising Argon (Ar) delivered at a rate of about 30 to about 70 sccm. The facet etch is continued until a tip with a sharp apex 109 is defined, which for a silicon column of about 1 micron diameter is approximately 100–200 seconds, depending on the RF power setting used for the facet etch.

Figure 4A:
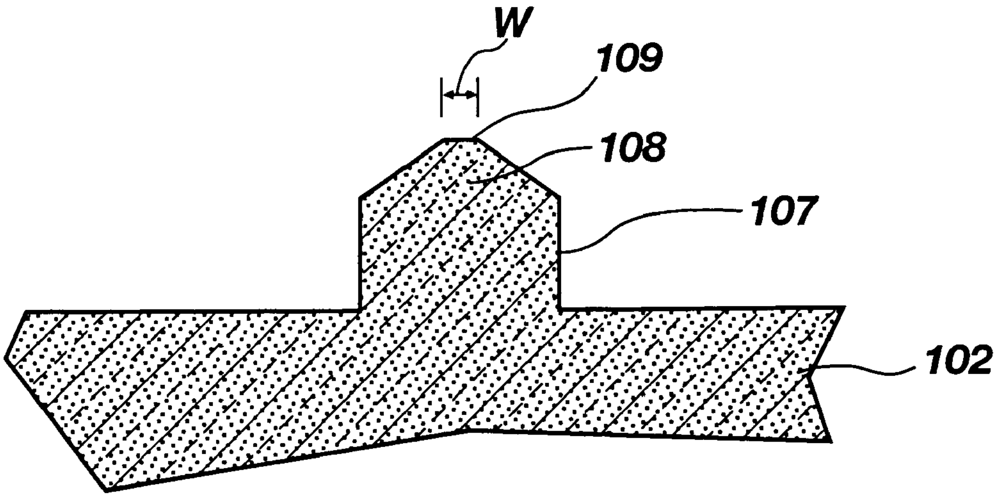
FIG. 4A is a cross-sectional schematic representation of a field emission tip, depicting an apex having a measurable lateral width.

As shown in FIG. 4A, apex 109 may have a measurable lateral width W. Preferably, the sharp apex 109 has a lateral width W of less than about 100 nm. The width or diameter of apex 109 may be as small as about 50 nm or less.

As shown in FIG. 4, during the facet etch redeposition material 110, which includes the material from the etched vertical column 106, may collect adjacent substantially vertical sidewall portion 107 of field emission tip 108.

Figure 5:
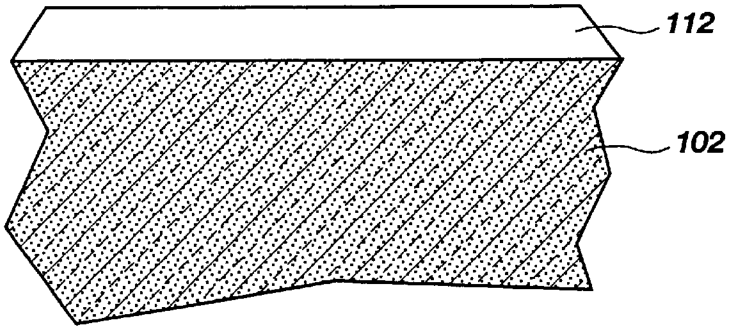
FIGS. 5–9 are cross-sectional views of another embodiment of a method for forming field emission tips according to the present invention.

FIGS. 5–9 illustrate another embodiment for forming field emission tips according to the present invention. As shown in FIG. 5, a low work function material 112, preferably $AlTiSi_x$ (aluminum titanium silicide), $TiSi_xN$ (titanium silicide nitride), or TiN (titanium nitride), is deposited on a substrate 102 by known processes, such as by the use of chemical vapor deposition (CVD) or sputtering.

Figure 6:
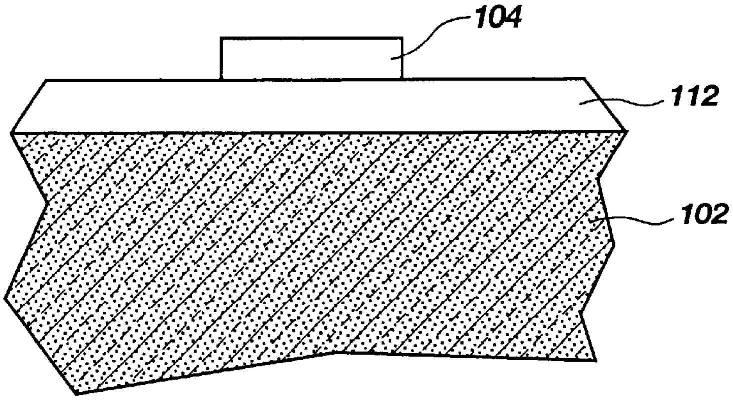
Figure 7:
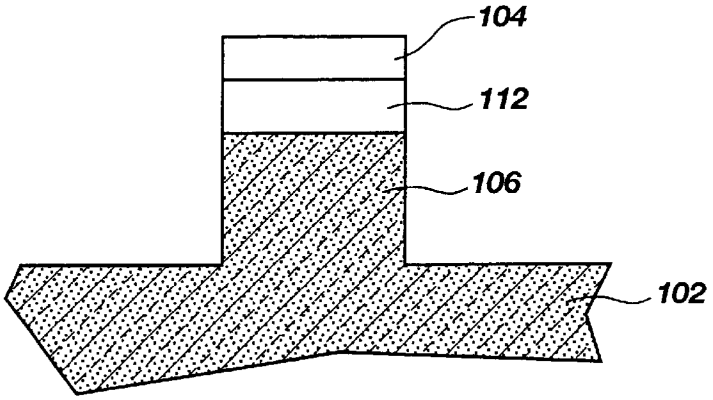
Figure 8:
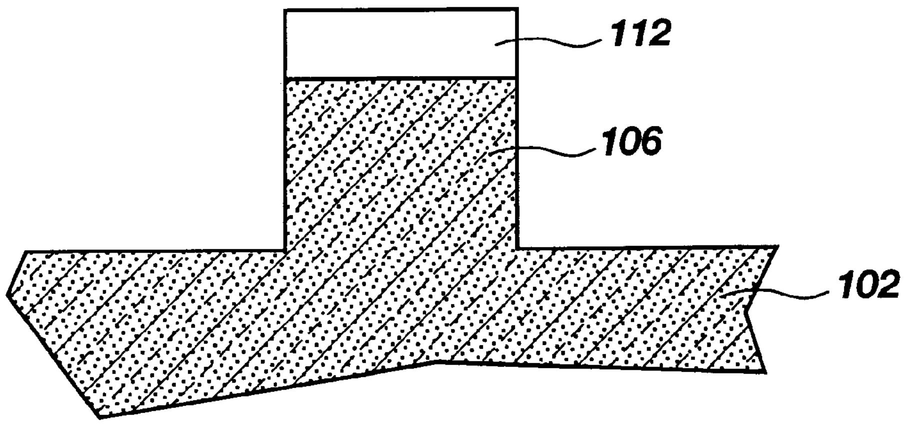
Figure 9:
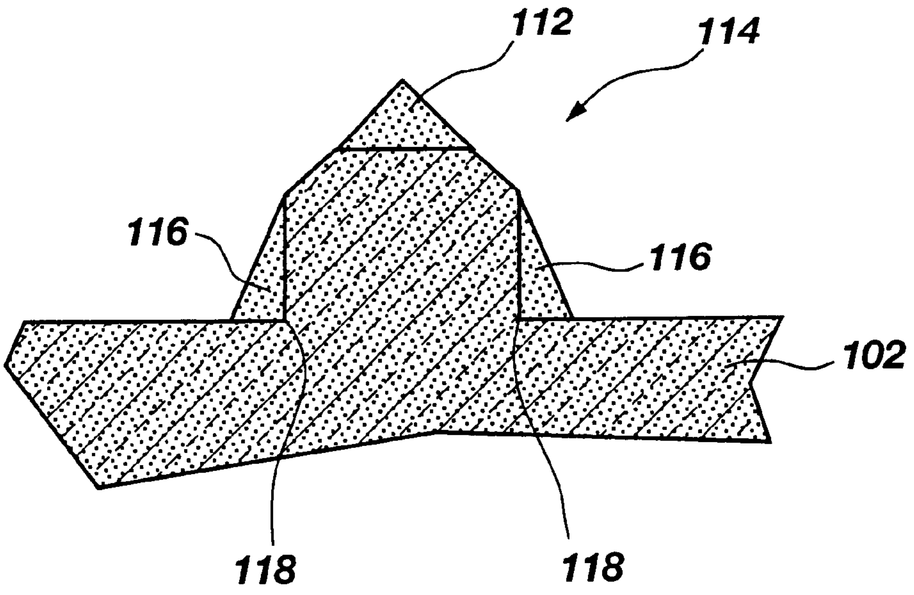

An etch mask material is patterned to define etch mask elements 104 on the low work function material 112, as shown in FIG. 6. The low work function material 112 and substrate 102 are then anisotropically etched by known dry etch techniques (e.g., high density plasma etching, RIE, magnetic ion etching (MIE), MERIE, plasma etching (PE), point plasma etching, plasma enhanced reactive ion etching (PERIE), or electron cyclotron resonance (ECR)) to form a substantially constant cross-section vertical column 106 from the portions of the substrate 102 and the low work function material 112 protected by etch mask element 104, as shown in FIG. 7. The etch mask element 104 is then removed, as shown in FIG. 8. The vertical column 106 capped with the low work function material 112 is then facet etched by the same techniques as described with respect to the previously disclosed method illustrated in FIGS. 1–4 to form a field emission tip 114 with low work function material 112 at the top portion thereof, as shown in FIG. 9. As also shown in FIG. 9, a redeposition material 116 resulting from the facet etch, comprising a mixture of material from the vertical column 106 and the low work function material 112, may, during the facet etch, collect in corners 118 at a junction between the substantially perpendicular portion 107 of the periphery of field emission tip 108 and substrate 102.

Figure 10:
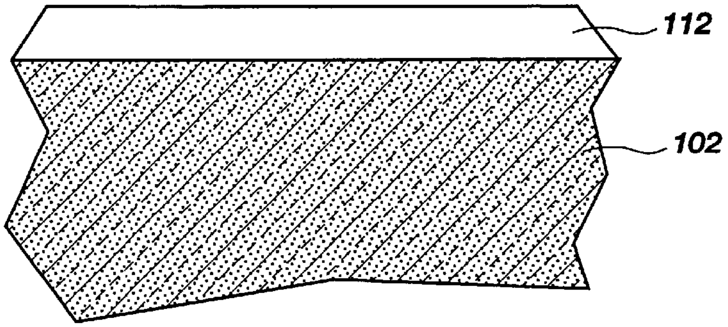
FIGS. 10–16 is a cross-sectional view of still another embodiment of a method for forming field emission tips according to the present invention.
Figure 11:
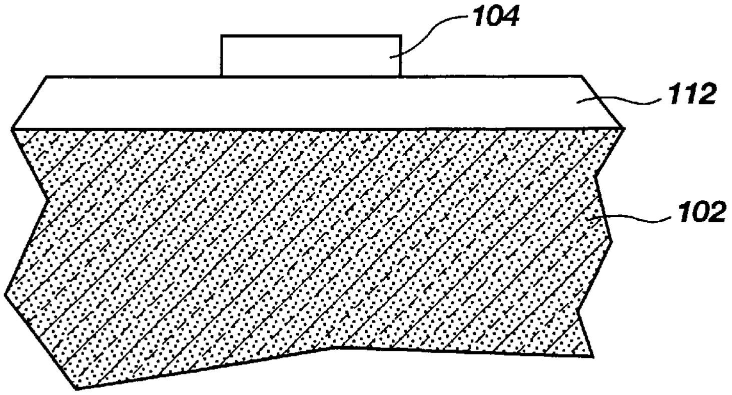
Figure 12:
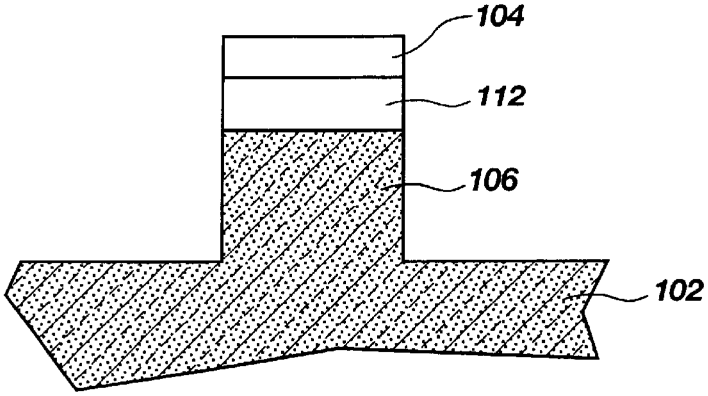
Figure 13:
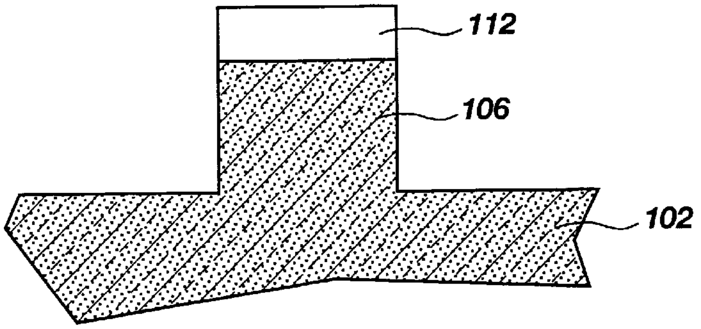
Figure 14:
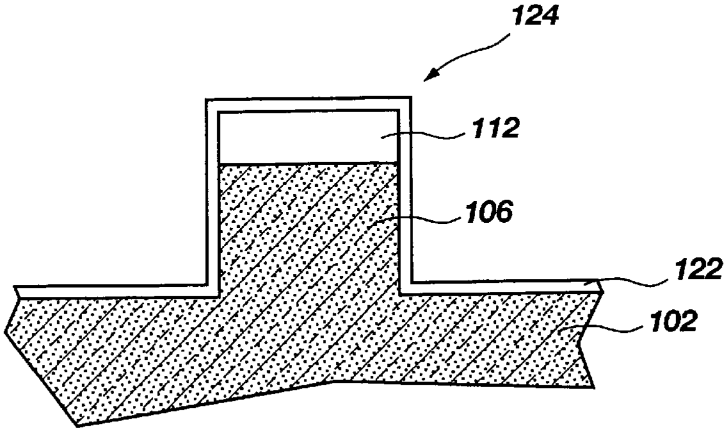
Figure 15:
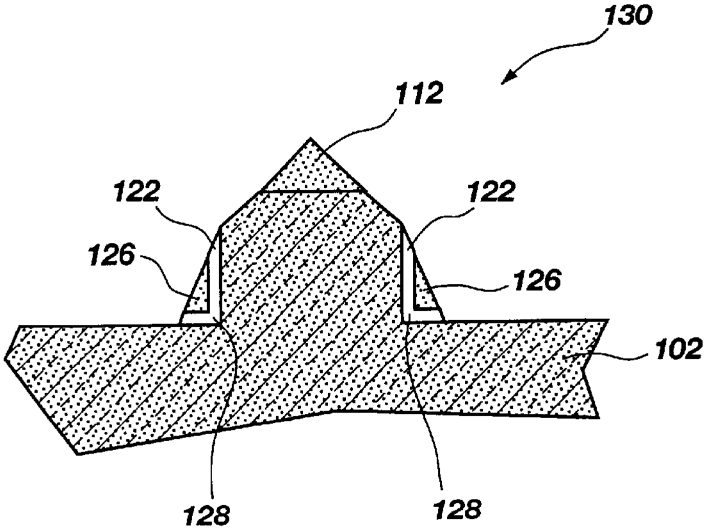
Figure 16:
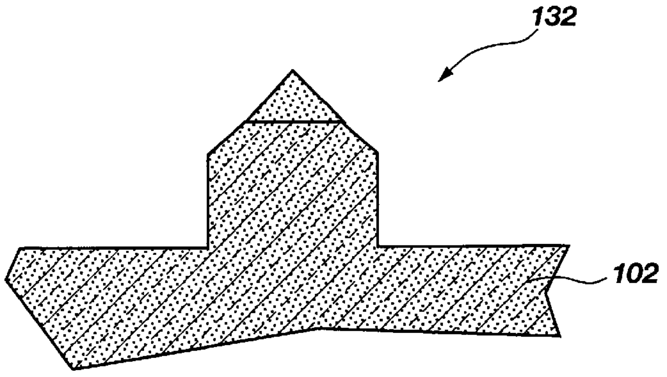

FIGS. 10–16 illustrate still another embodiment for forming field emission tips according to the present invention. As shown in FIG. 10, a low work function material 112 is deposited on a substrate 102. An etch mask material is patterned to form etch mask elements 104 on the low work function material 112, as shown in FIG. 11. The low work function material 112 and substrate 102 are then anisotropically etched by known techniques (e.g., high density plasma etching, RIE, MIE, MERIE, PE, point plasma etching, PERIE, or ECR) to form a vertical column 106 of substantially constant cross-section from portion of the substrate 102 and the low work function material 112 protected by etch mask elements 104, as shown in FIG. 12. Etch mask elements 104 are then removed, as shown in FIG. 13. A sacrificial material 122, such as silicon dioxide or tetraethyl orthosilicate (TEOS), is then conformally deposited over the vertical column 106 capped with the low work function material 112 to form a covered structure 124, as shown in FIG. 14. The covered structure 124 is then facet etched, such as by the same techniques as those described previously herein with respect to FIGS. 1–4 to form a low work function material-tipped, field emission tip 130, as shown in FIG. 15. As also shown in FIG. 15, a redeposition material 126 produced during the facet etch, comprising a mixture of material from the vertical column 106, the low work function material 112, and the sacrificial material 122, collects in exposed corners 128 of the sacrificial material 122 at a junction of the vertical column 106 and the base substrate 102 during the facet etch. Although such redeposition material 126 would be difficult to remove if deposited directly on the vertical column 106 and the base substrate 102 surfaces, the presence of the sacrificial material 122 under the redeposited material 126 allows the redeposition material 126 to be removed with a clean-up technique, as illustrated in FIG. 16, such as by a hydrofluoric acid (HF) dip or diluted HF dip, as known in the art. The mask element is then removed, as known in the art to expose a cleaned, low work function material tipped, field emission tip 132.

Figure 17:
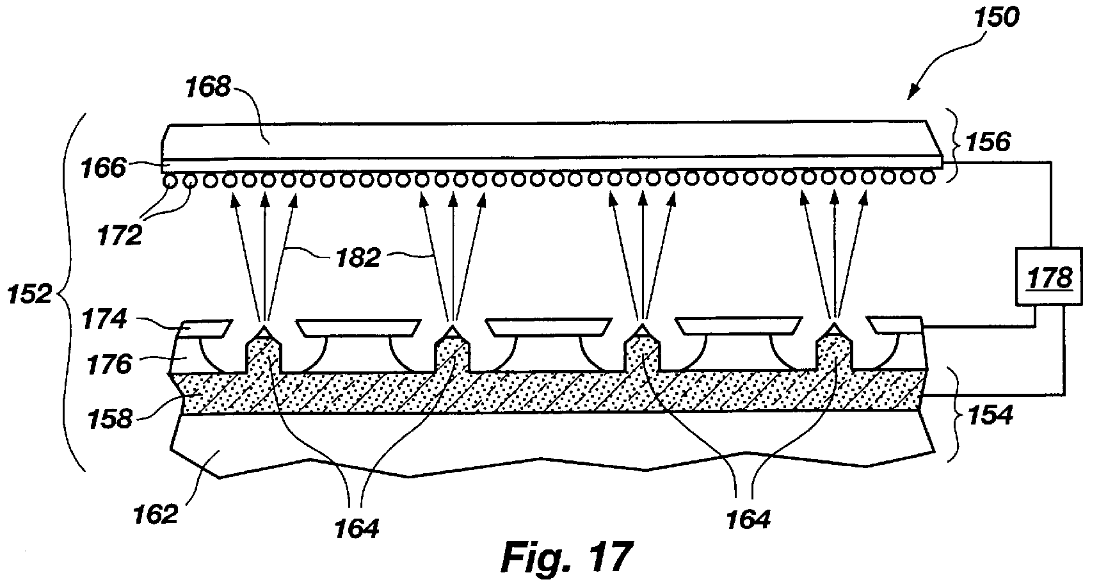
FIG. 17 is a cross-sectional view of a cold cathode field emission display including field emission tips formed by a method according to the present invention.
Figure 18:
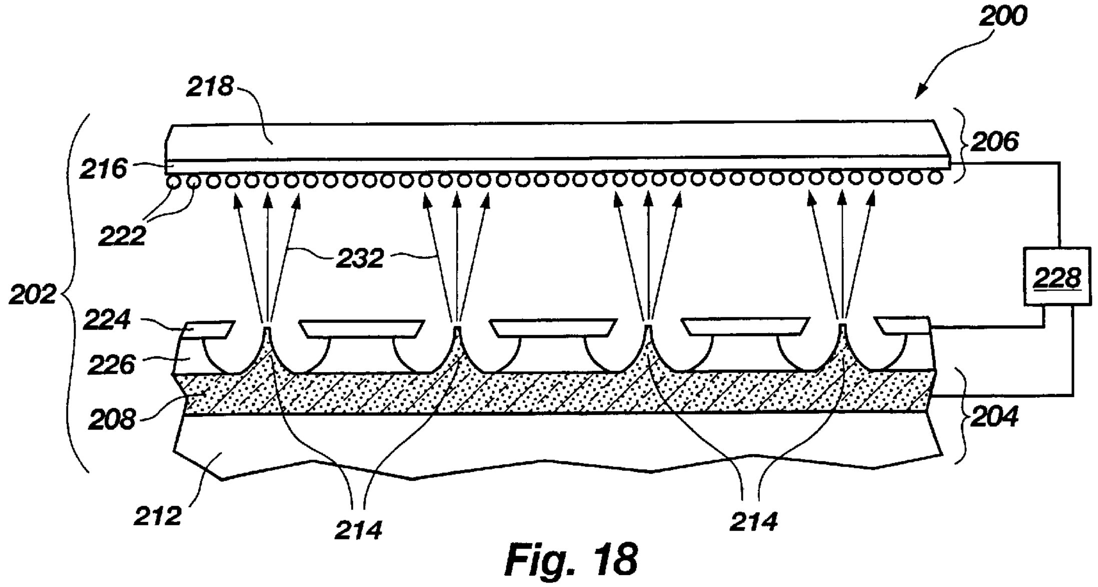
FIG. 18 is a cross-sectional view of an exemplary cold cathode field emission display.
Figure 19:
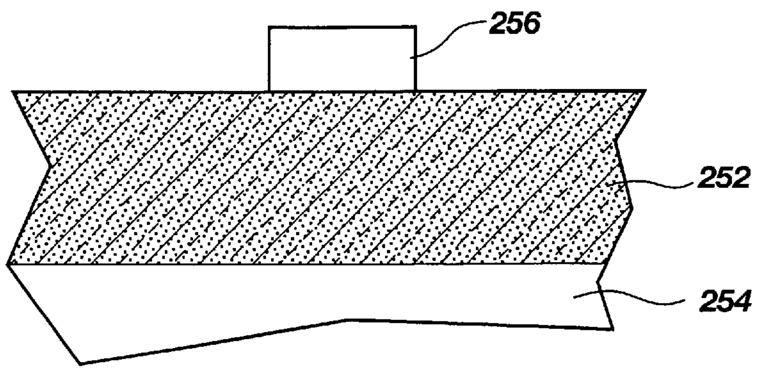
FIGS. 19–21 are cross-sectional views of a conventional method of forming a field emission tip.
Figure 20:
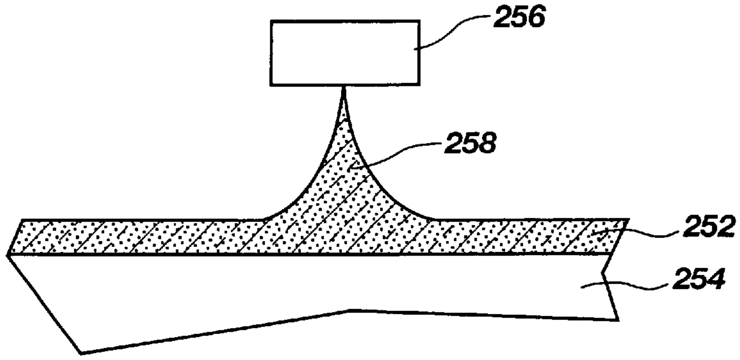
Figure 21:
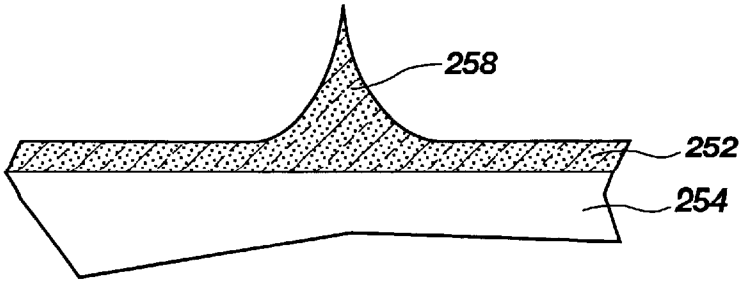
Figure 22:
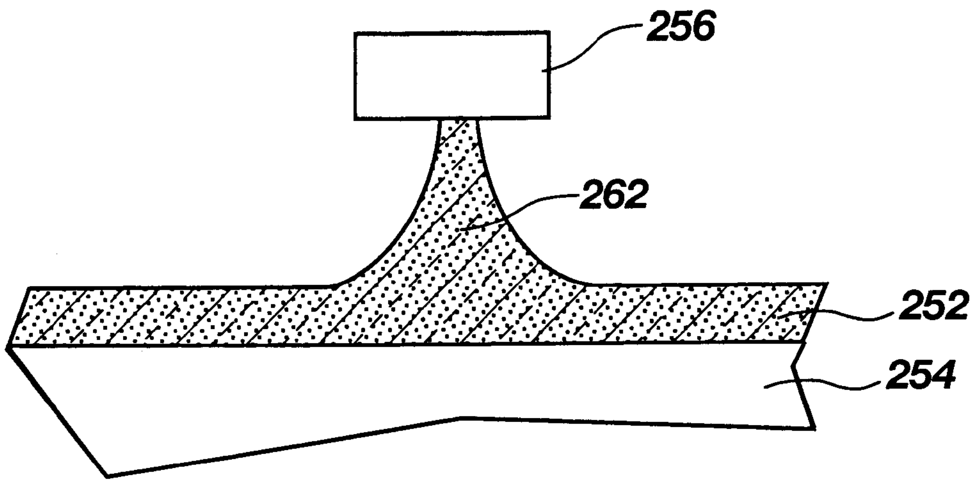
FIG. 22 is a cross-sectional view of a field emission tip formed by the conventional method illustrated in FIGS. 19–21 when the tip etching is prematurely terminated.
Figure 23:
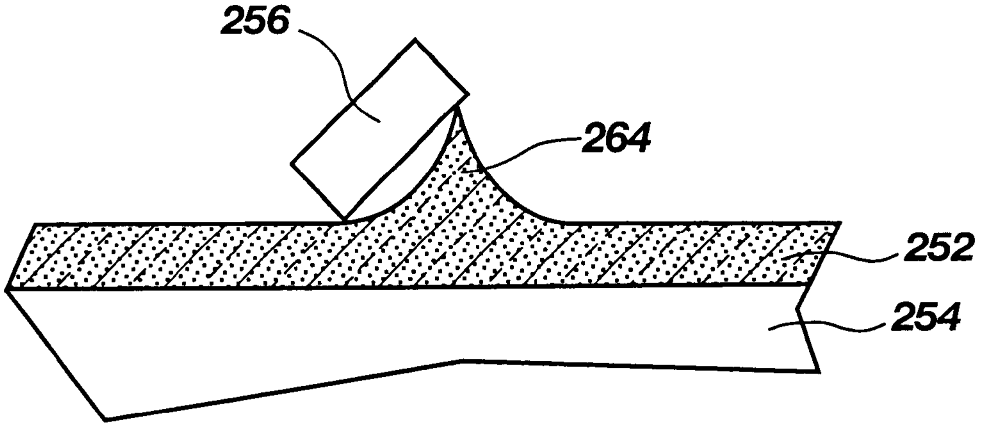
FIG. 23 is a cross-sectional view of a field emission tip formed by the conventional method illustrated in FIGS. 19–21 when the tip etching is not terminated prior to over-etching the tip.

FIG. 17 illustrates an exemplary flat panel cold cathode FED 150 including low work function material tipped, field emission tips 164 formed by a method of the present invention. The flat panel cold cathode FED 150 is similar in structure arrangement to the conventional flat panel cold cathode FED 200 illustrated in FIG. 18, and comprises a flat vacuum cell 152 having a cathode 154 and an anode 156 spaced a distance apart from one another. The cathode 154 comprises a first conductive substrate material 158 disposed on a dielectric support 162, and the low work function material tipped, field emission tips 164 distributed across the first conductive substrate material 158. The anode 156 comprises a second conductive material 166 disposed on an interior surface of a transparent plate 168, and a phosphorescent or fluorescent material 172 coated on the second conductive material 166. A gate 174 is formed atop a grid of dielectric material 176 deposited on the cathode 154. The low work function material tipped, field emission tips 164 reside within openings in the gate 174 and in the dielectric material 176, such that the gate 174 surrounds each low work function material tipped, field emission tip 164. The gate 174 acts as a low potential anode (i.e., lower potential than the anode 156), such that when a voltage differential, generated by a voltage source 178, is applied between the cathode 154 (strong negative charge), the gate 174 (weak positive charge), and the anode 156 (strong positive charge), a Fowler-Nordheim electron emission is initiated resulting in a stream of electrons 182 being emitted from the low work function material tipped, field emission tips 164 toward the phosphorescent or fluorescent material 172. The electron stream 182 strikes and stimulates the phosphorescent or fluorescent material 172. The stimulated phosphorescent or fluorescent material 172 emit photons (light) (not shown) through the second conductive material 166 and the transparent plate 168 to form a visual image.

Having thus described in detail preferred embodiments of the present invention, it is to be understood that the invention defined by the appended claims is not to be limited by particular details set forth in the above description as many apparent variations thereof are possible without departing from the spirit or scope thereof.

What is claimed is:

1. A method for fabricating a tip of a field emission array, comprising: forming a structure with substantially vertical sidewalls, an upper surface, and at least one corner at an edge of said upper surface, said structure comprising at least one of semiconductive material and conductive material; and facet etching said at least one corner of said structure with said upper surface thereof exposed to define a substantially pointed tip at a top portion thereof.

2. The method of claim 1, wherein said forming said structure comprises anisotropically etching a layer comprising at least one of semiconductive material and conductive material.

3. The method of claim 2, further comprising disposing a mask defining a location and cross-sectional shape of said structure over said layer prior to said forming.

4. The method of claim 2, further comprising disposing a layer of low work function material over said layer comprising at least one of semiconductive material and conductive material prior to said forming.

5. The method of claim 1, wherein said substantially pointed tip comprises low work function material.

6. The method of claim 4, wherein said low work function material is selected from the group comprising aluminum titanium silicide, titanium silicide nitride, titanium nitride, tri-chromium mono-silicon, and tantalum nitride.

7. The method of claim 4, further comprising disposing a layer of sacrificial material over said layer of low work function material.

8. The method of claim 7, wherein said disposing said layer of sacrificial material comprises disposing a layer comprising silicon oxide.

9. The method of claim 7, further comprising removing remaining portions of said layer of sacrificial material following said facet etching.

10. The method of claim 2, further comprising disposing a layer of sacrificial material over said layer comprising at least one of semiconductive material and conductive material.

11. The method of claim 10, wherein said disposing said layer of sacrificial material comprises disposing a layer comprising silicon oxide.

12. The method of claim 10, further comprising removing remaining portions of said layer of sacrificial material following said facet etching.

13. The method of claim 1, further comprising removing material etched from said structure during said facet etching that is redeposited adjacent at least one of said substantially vertical sidewalls.

14. The method of claim 1, wherein said facet etching comprises reactive ion etching said structure.

15. A method for fabricating a field emission array, comprising:

forming a plurality of structures with substantially vertical sidewalls, an upper surface, and at least one corner at an edge of said upper surface, each of said plurality of structures comprising at least one of semiconductive material and conductive material; and facet etching said at least one corner of each structure of said plurality of structures with said upper surface thereof exposed to define substantially pointed tips at a top portion thereof.

16. The method of claim 15, wherein said forming said plurality of structures comprises anisotropically etching a layer comprising at least one of semiconductive material and conductive material.

17. The method of claim 16, further comprising disposing a mask defining locations and cross-sectional shapes of each of said plurality of structures over said layer prior to said forming.

18. The method of claim 16, further comprising disposing a layer of low work function material over said layer comprising at least one of semiconductive material and conductive material prior to said forming.

19. The method of claim 15, wherein said substantially pointed tips comprise low work function material.

20. The method of claim 18, wherein said low work function material is selected from the group comprising aluminum titanium silicide, titanium silicide nitride, titanium nitride, tri-chromium mono-silicon, and tantalum nitride.

21. The method of claim 18, further comprising disposing a layer of sacrificial material over said layer of low work function material.

22. The method of claim 21, wherein said disposing said layer of sacrificial material comprises disposing a layer comprising silicon oxide.

23. The method of claim 21, further comprising removing at least portions of said layer of sacrificial material that remain laterally adjacent each of said plurality of structures following said facet etching.

24. The method of claim 15, further comprising disposing a layer of sacrificial material over said layer comprising at least one of semiconductive material and conductive material.

25. The method of claim 24, wherein said disposing said layer of sacrificial material comprises disposing a layer comprising silicon oxide.

26. The method of claim 24, further comprising removing at least portions of said layer of sacrificial material that remain laterally adjacent each of said plurality of structures following said facet etching.

27. The method of claim 15, further comprising removing redeposition material adjacent said substantially vertical sidewalls.

28. The method of claim 15, wherein said facet etching comprises reactive ion etching said plurality of structures.

29. A method for fabricating a field emission display, comprising: fabricating a cathode, including:

forming a plurality of structures with substantially vertical sidewalls, an upper surface, and at least one corner at an edge of said upper surface, each of said plurality of structures comprising at least one of semiconductive material and conductive material; and facet etching said at least one corner of each of said plurality of structures with said upper surface thereof exposed to define a substantially pointed tip at a top portion thereof;

fabricating a grid over said cathode with said substantially pointed tips being exposed therethrough;

positioning an anode display screen over said cathode and spaced apart therefrom;

creating a substantial vacuum between said anode display screen and said cathode; and associating a voltage source with said cathode, said grid, and said anode display screen.

30. The method of claim 29, wherein said forming said plurality of structures comprises anisotropically etching a layer comprising at least one of semiconductive material and conductive material.

31. The method of claim 30, further comprising disposing a mask over said layer prior to said forming.

32. The method of claim 30, further comprising disposing a layer of low work function material over said layer comprising at least one of semiconductive material and conductive material prior to said forming.

33. The method of claim 29, wherein said substantially pointed tips comprise said low work function material.

34. The method of claim 32, wherein said low work function material is selected from the group comprising aluminum titanium silicide, titanium silicide nitride, titanium nitride, tri-chromium mono-silicon, and tantalum nitride.

35. The method of claim 32, further comprising disposing a layer of sacrificial material over said layer of low work function material.

36. The method of claim 35, wherein said disposing said layer of sacrificial material comprises disposing a layer comprising silicon oxide.

37. The method of claim 35, further comprising removing at least portions of said layer of sacrificial material that remain laterally adjacent each of said plurality of structures following said facet etching.

38. The method of claim 29, further comprising disposing a layer of sacrificial material over said layer comprising at least one of semiconductive material and conductive material.

39. The method of claim 38, wherein said disposing said layer of sacrificial material comprises disposing a layer comprising silicon oxide.

40. The method of claim 38, further comprising removing at least portions of said layer of sacrificial material remaining laterally adjacent each of said plurality of structures following said facet etching.

41. The method of claim 29, further comprising removing material etched from said structure during said facet etching that is redeposited adjacent at least one of said substantially vertical sidewalls.

42. The method of claim 29, wherein said facet etching comprises reactive ion etching said plurality of structures.

43. A method for fabricating a field emission tip, comprising:

forming a structure with substantially vertical sidewalls, an upper surface, and at least one corner at an edge of said upper surface, said structure comprising at least one of semiconductive material and conductive material; and dry etching said at least one corner of said structure with said upper surface exposed and at a faster rate than substantially planar surfaces of said structure are etched.

44. The method of claim 43, wherein said dry etching is effected at a rate of at least about four times faster than dry etching of said substantially planar surfaces.

* * * * *

UNITED STATES PATENT AND TRADEMARK OFFICE

CERTIFICATE OF CORRECTION

PATENT NO. : 6,387,717 B1 
DATED : May 14, 2002
INVENTOR(S) : Guy T. Blalock, Sanh D. Tang and Zhaohui Huang It is certified that error appears in the above-identified patent and that said Letters Patent is hereby corrected as shown below:

Title page,
Item [56] References Cited, U.S. PATENT DOCUMENTS, insert -- 5,229,331 7/1993 Doan et al. --
Item [57] ABSTRACT,
Line 8, insert a comma after "substrate"

Column 1,
Line 27, delete the comma after "218"
Line 36, insert a hyphen between "low" and "potential"
Line 42, insert a comma after "initiated"
Line 47, change "emit" to -- emits --
Line 54, change "beneath" to -- define --

Column 2,
Line 10, insert a comma after "5,312,514"
Line 11, insert a comma after "patent")"
Line 14, change "etched" to -- etch --
Line 30, change "non-uniform" to -- nonuniform --

Column 3,
Line 24, insert a hyphen between "high" and "vacuum"
Line 24, change "control" to -- controlled --
Line 25, insert a hyphen between "high" and "vacuum"'
Line 26, insert a hyphen between "high" and "vacuum"
Line 31, after "causes" delete "in"
Line 53, change "allow" to -- allows --; change "pack" to -- packed --; and insert a comma after "another"
Line 54, before "a higher" insert -- results in --

Column 4,
Line 1, after "low" and before "function" insert -- work --
Line 28, insert a hyphen between "material" and "tipped"
Lines 53-54, insert a hyphen between "material" and "tipped"
Line 65, delete "by"

Column 5,
Line 22, change "is a" to -- are -- and change "view" to -- views --
Line 28, after "exemplary" and before "cold" insert -- conventional --
Line 64, after "form" and before "under" insert -- from the substrate 102 and --
Line 65, delete "from the substrate 102"

UNITED STATES PATENT AND TRADEMARK OFFICE
CERTIFICATE OF CORRECTION

PATENT NO. : 6,387,717 B1 
DATED : May 14, 2002
INVENTOR(S) : Guy T. Blalock, Sanh D. Tang and Zhaohui Huang It is certified that error appears in the above-identified patent and that said Letters Patent is hereby corrected as shown below:

Column 6,
Line 2, after "etch" and before "at" insert -- conducted -- and after "watts," insert -- at --
Line 3, after "and" and before "an" insert -- employing --
Line 25, insert a comma after "etch"
Line 37, change "elements" to -- element --
Line 60, delete "107" and change "108" to -- 114 --
Line 66, change "elements" to -- element --

Column 7,
Line 5, after "from" and before "portion" insert -- the --
Line 7, change "elements" to -- element --
Line 8, change "elements" to -- element -- and change "are" to -- is --
Line 16, delete the comma after "-tipped"
Line 31, insert a comma after "art"
Line 32, insert a hyphen between "material" and "tipped"
Line 34, insert a hyphen between "material" and "tipped,"
Line 38, delete the comma after "18"
Line 43, insert a hyphen between "material" and "tipped" and after "164" insert -- are --
Line 50, insert a hyphen between "material" and "tipped"
Line 53, insert a hyphen between "material" and "tipped"
Line 54, insert a hyphen between "low" and "potential"
Line 59, insert a comma after "initiated"
Line 61, insert a hyphen between "material" and "tipped"
Line 65, change "emit" to -- emits --

Signed and Sealed this

Fifth Day of August, 2003

JAMES E. ROGAN
*Director of the United States Patent and Trademark Office*